United States Patent
Igel et al.

[11] Patent Number: 5,888,882
[45] Date of Patent: Mar. 30, 1999

[54] PROCESS FOR SEPARATING ELECTRONIC DEVICES

[75] Inventors: Guenter Igel, Teningen; Martin Mall, Freiburg, both of Germany

[73] Assignee: Deutsche ITT Industries GmbH, Freiburg, Germany

[21] Appl. No.: 832,766

[22] Filed: Apr. 4, 1997

[30] Foreign Application Priority Data

Apr. 4, 1996 [DE] Germany .................. 196 13 561

[51] Int. Cl.$^6$ .......................... H01L 21/304; H01L 21/84
[52] U.S. Cl. .................... 438/460; 438/33; 438/464; 438/948; 437/209; 324/765
[58] Field of Search .................. 438/460, 113, 438/33, 42, 464, 68, 948; 437/209; 324/765

[56] References Cited

U.S. PATENT DOCUMENTS

| | | | |
|---|---|---|---|
| 3,668,774 | 6/1972 | Eger | 438/464 |
| 3,795,045 | 3/1974 | Dumas . | |
| 3,836,446 | 9/1974 | Tiefert et al. . | |
| 4,604,161 | 8/1986 | Araghi . | |
| 4,722,130 | 2/1988 | Kimura et al. . | |
| 4,769,108 | 9/1988 | Deppe et al. . | |
| 4,962,056 | 10/1990 | Yamaki | 438/460 |
| 5,174,188 | 12/1992 | Petroz . | |
| 5,270,261 | 12/1993 | Bertin et al. | 437/209 |
| 5,272,114 | 12/1993 | Van Berkum et al. | 438/33 |
| 5,440,241 | 8/1995 | King et al. | 324/765 |
| 5,736,453 | 10/1995 | Kadonishi | 438/460 |

FOREIGN PATENT DOCUMENTS 0 704 895   4/1995   European Pat. Off. .

OTHER PUBLICATIONS

Stanley Wolf PhD Silison Processing For The VLSI Era Lattice Press p. 3 figure 1–3, 1990.

*Primary Examiner*—Charles Bowers
*Assistant Examiner*—David S. Blum
*Attorney, Agent, or Firm*—Plevy & Associates

[57] ABSTRACT

A process for separating electronic devices connected with one another in a body, the process including thinning the side of the body remote from the electronic devices, separating the electronic devices, and testing electrical parameters of the electronic devices after the thinning of the body. The handling of the body is improved by applying to the side of the body containing the electronic devices, prior to the thinning process, an electrically nonconductive auxiliary layer in which respective contact openings are formed above the electronic devices to expose the contact(s) of the respective electronic device.

18 Claims, 2 Drawing Sheets

PROCESS FOR SEPARATING ELECTRONIC DEVICES

FIELD OF THE INVENTION

The present invention relates generally to electronic device processing and more particularly to a process for separating electronic devices connected with one another in a body, by thinning a side of the body remote from the electronic devices, separating the electronic devices, and testing electrical parameters of the electronic devices after the thinning of the body.

BACKGROUND OF THE INVENTION

Processes for separating electronic devices connected with one another in a body, by thinning a side of the body remote from the electronic devices, are used in semiconductor technology, for example. There, electronic devices are formed in a semiconductor wafer, with the devices having a substantially smaller thickness than the semiconductor wafer. This requires that the semiconductor wafer be thinned to the desired final thickness of the electronic devices. Semiconductor thinning may be accomplished by mechanically removing the semiconductor material or by etching. The electronic devices are then separated, generally by sawing. Since only good electronic devices or devices with predetermined electrical properties are to be selected and further processed, the electrical parameters of the electronic devices must be tested before the devices are selected and fed to subsequent processing apparatus. The subsequent processing apparatus is generally a bonder which attaches the electronic devices to a carrier. The electrical parameters must thus, be tested on the electronic devices connected with one another in the thinned wafer or on the separated devices.

Both of the above techniques for testing, involve considerable difficulties in practice. Separate electronic devices are difficult to handle. Furthermore, the backs of such devices are not accessible for measurements, since the devices are attached to a tape. If the electronic devices are measured before being mechanically separated, the problem arises that the measurements are relatively inaccurate, since both the mechanical and electrical properties of the electronic devices are subsequently affected by the separation, which is accomplished by sawing, for example. For the measurement, the thinned wafer must be mechanically handled, e.g., transported and fixed. This presents problems since a thinned wafer, which has a small thickness, is difficult to handle. Since the present trend is toward electronic devices with as little thickness as possible, which is particularly necessary for power devices, the handling of electronic devices in the thinned wafer form is becoming increasingly difficult. Thus, electrical testing and measuring of the electronic devices in a semiconductor wafer is in many cases problematic.

It is, therefore, an object of the present invention to provide a process for separating electronic devices which enables the electronic devices to be tested more reliably after the thinning of the body.

SUMMARY

The present invention is directed toward a process for separating electronic devices connected with one another in a body. The process comprises covering a side of the body containing the electronic devices with an electrically non-conductive auxiliary layer and forming openings in the auxiliary layer above the electronic devices, each of the openings exposing a contact of each of the electronic devices. Next, a side of the body remote from the electronic devices is thinned. Then, the electrical parameters of each of the electronic devices are tested using the exposed contacts. After testing, the electronic devices are separated.

In another aspect of the present invention, the auxiliary layer has a predetermined thickness and the body includes an intermediate region connecting every two adjacent electronic devices. A depression is then formed in the auxiliary layer above each intermediate region, the depression being of a predetermined depth which is less than the predetermined thickness of the auxiliary layer.

Another aspect of the present invention involves forming indentations in the side of the body remote from the electronic devices, each of the indentations being formed in the area of a respective one of the intermediate regions connecting every two adjacent electronic devices, each of the indentations extending in a direction toward the auxiliary layer.

In one embodiment of the present invention, the step of testing is performed after the step of forming indentations.

In another embodiment of the present invention, the auxiliary layer is made from a polyimide material. In still another embodiment of the present invention, the polyimide material is photosensitive.

In a further embodiment of the present invention, the side of the body remote from the electronic devices is metallized after the step of forming the indentations. In another embodiment of the present invention, the step of metallizing the side of the body remote from the electronic devices is performed prior to the step of forming the indentations.

In still another embodiment of the present invention, a delay layer is formed on the side of the body remote from electronic devices prior to the step of thinning, the delay layer operating to delay the thinning of the body in step thinning, and openings are created in the delay layer in the area of the intermediate regions prior to the step of thinning. The step of thinning and the step of forming indentations are performed simultaneously.

BRIEF DESCRIPTION OF THE DRAWINGS

The invention will now be explained in more detail with reference to the accompanying drawings, in which.

DETAILED DESCRIPTION OF THE INVENTION

The process according to the present invention will be described as applied to the separation of electronic devices in a semiconductor wafer. It should be understood, however, that the process of the present invention can also be applied to the separation of electronic devices in bodies which are other than semiconductor wafers.

Figure 1:
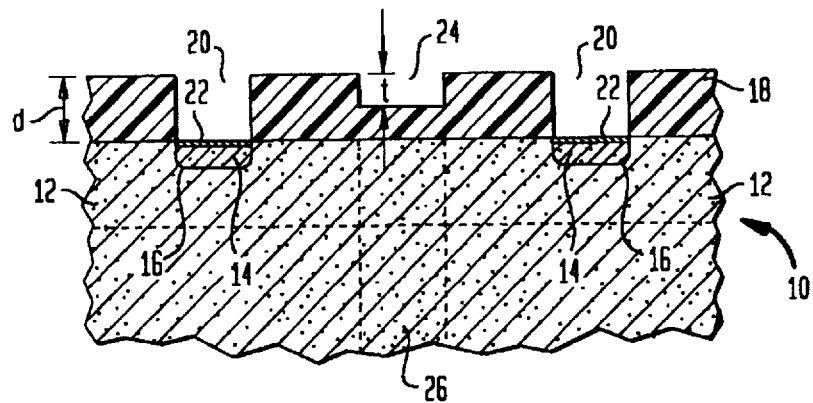
FIG. 1 is a cross section of a part of a body with electronic devices after deposition of an auxiliary layer.

Referring now to FIG. 1, a segment of a semiconductor wafer 10 showing only two electronic devices 12 connected with one another is depicted in order to simplify the description of the present invention. One of ordinary skill in the art will recognize that the entire semiconductor wafer would have a plurality of such electronic devices. The devices 12 shown are diodes, although this is not to be considered as a limitation to the scope of the invention. Regions 14, whose conductivity type is opposite to that of the semiconductor wafer 10, are provided at the surface of the semiconductor wafer 10, so that pn junctions are produced at the respective interfaces 16. The semiconductor wafer 10 is covered by an auxiliary layer 18. The auxiliary layer 18 has contact openings 20 which each expose a contact 22 of the respective electronic device 12. In the embodiment shown, the contacts 22 are conductive layers, typically of metal, which cover the respective regions 14 at the wafer surface. In the auxiliary layer 18, a depression 24 of depth t is provided between the two electronic devices 12 above an intermediate region 26 of the semiconductor wafer 10. It is necessary that the depth t be less than the thickness d of the auxiliary layer 18. The depression 24 is formed above the respective intermediate region between every two adjacent electronic devices on the wafer 10. The depression can be used as a marker for the separation of the electronic devices.

The contact openings 20 and depression 24 in the auxiliary layer 18 are formed by a photolithographic technique using a suitable mask layer. Advantageously, a partially transparent mask layer is used for forming the contact openings 20 and the depression 24 in the auxiliary layer 18. The contact openings 20 and depression 24 can then be formed simultaneously using only one mask layer.

The material and thickness of the auxiliary layer 18 are chosen so that sufficient mechanical strength is achieved so that during the testing of the electrical parameters, the electronic devices will remain interconnected by the auxiliary layer 18 as will be explained further. The material and thickness of the auxiliary layer 18 are also chosen to optimize the protective properties for the surface, and the like. In the embodiment shown in FIG. 1, the auxiliary layer 18 is made of a polyimide which is preferably photosensitive. Such a polyimide layer is electrically nonconductive and temperature-stable, and has a mechanical strength which is favorable for the process.

Figure 2:
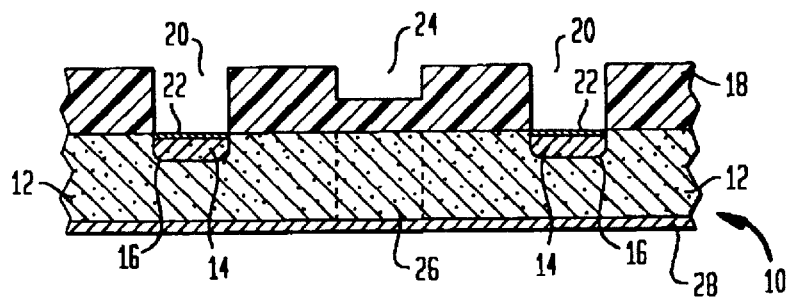
FIG. 2 shows the part of the body of FIG. 1 after the body has been thinned.

Next, the semiconductor wafer IO is thinned, and the thinned side is provided with a metal layer 28 as shown in FIG. 2. This is advantageous in case of all electronic devices which require a metallized back, e.g., for making contact thereto.

Figure 3:
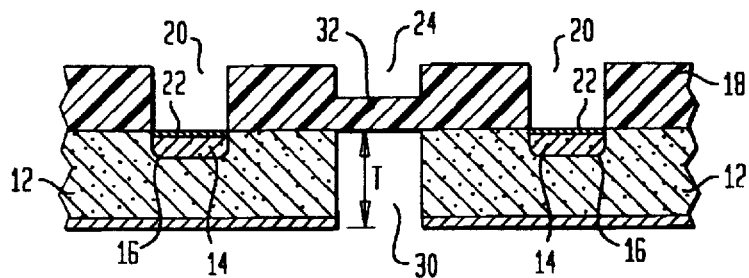
FIG. 3 shows the part of the body of FIG. 2 after indentations have been formed between the electronic devices.

Then, as shown in FIG. 3, an indentation 30 is formed between the two electronic devices 12 by removing the intermediate region 26 of the semiconductor wafer 10. This may be done by etching, for example. What is important is that the depth T of the indentation 30 is such that sufficient electric isolation is provided between the electronic devices 12.

Figure 4:
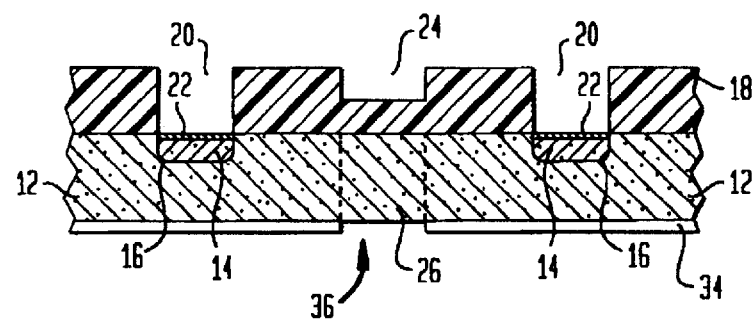
FIG. 4 shows the part of the body of FIG. 1, after processing according to another embodiment of the present invention.

In a further embodiment of the present invention as shown in FIG. 4, the metallizing step of FIG. 2, takes place after the formation of the indentation 30, so that the sidewalls of the electronic devices 12 can be metallized simultaneously with the backs of the electronic devices 12.

Figure 5:
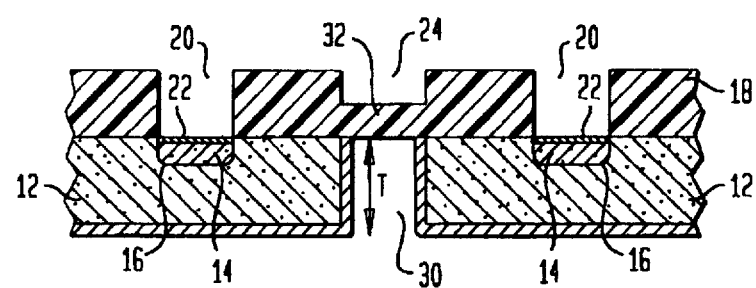
FIG. 5 shows the part of the body of FIG. 1, after processing according to still another embodiment of the present invention.

In a further embodiment of the present invention as shown in FIG. 4, a delay layer 34 for delaying the thinning process is provided in the area of the wafer to be thinned, and the thinning of the wafer and the formation of the indentation 30 (FIG. 5) are performed simultaneously by removal of the material of the wafer 10. The delay layer 34 includes openings 36 under the intermediate region 26. The effect of the delay layer 34 is that the material in the intermediate region 26 is removed faster than in the other areas of the wafer 10. This eliminates the need to mechanically handle the thinned wafer 10 for forming the indentation 30. The wafer material is preferably removed by etching, particularly by plasma etching.

In any case, the electronic devices 12 are now electrically separated from each other. Mechanically, they are still linked by a connecting portion 32 of the auxiliary layer 18 below the depression 24. Because of the mechanical strength of the auxiliary layer 18, the electronic devices 12 are held together so that their electrical parameters can be measured via the contacts 22. Since the electronic devices 12 are electrically isolated from each other, each of their electrical parameters can be measured without the measurement being influenced by the other electronic device 12. Since the respective intermediate regions 26 between every two electronic devices 12 have already been removed, the electrical properties of the electronic devices 12 are no longer changed by a separating process. In the embodiment shown, the indentation 30 extends up to the auxiliary layer 18. In other embodiments of the present invention, they may also extend into, or end in front of, the auxiliary layer 18. More specifically, in some embodiments of the present invention a thin portion of the wafer 10 remains below the auxiliary layer 18. Through this portion, the shape of the separated electronic devices can be influenced, for example. It may also be advantageous if the indentation 30 extends into the auxiliary layer 18. This makes it possible to influence the thickness of the auxiliary layer remaining above the intermediate region 26. The thickness of the material remaining in the intermediate regions is thus determined by the depth T of the indentations in the body and the depth t of the depressions in the auxiliary layer.

As is now apparent, the auxiliary layer 18 according to the invention, allows greater rigidity of the thinned body to be achieved. The contact openings 20 in the auxiliary layer 18 permit access to the contacts 22 of the electronic devices 12, so that the electrical parameters of the devices 12 can be tested. Several contact openings may be provided above a respective device. This may be advantageous if the electronic devices have a large area and spaced-apart contacts. Because of the greater rigidity of the body, testing of the electronic devices becomes possible in the thinned condition of the body. The auxiliary layer is preferably deposited prior to the thinning of the body.

After the electrical parameters of the electronic devices 12 have been tested, the devices which are to be used are selected and fed to an apparatus for further processing (not shown). In this apparatus, the connecting portion 32 of the auxiliary layer 18 must be removed, so that the electronic devices 12 are mechanically separated. This may be done either in a separate apparatus, such a dicing station with a laser, a plasma cutting device, etc., or in the apparatus for the next processing step, generally a bonding apparatus for mounting the electronic devices on a carrier. The method used for separating the electronic devices 12 should be considered when choosing thickness (d-t) of the connecting portion 32.

Once the electronic devices 12 have been separated, the auxiliary layer 18 may be removed if it is not needed or if it has unfavorable properties for the subsequent use of the devices. The electronic devices 12 are then further processed in the conventional manner using techniques familiar to those skilled in the art.

It should be understood that the embodiments described herein are merely exemplary and that a person skilled in the art may make many variations and modifications to the disclosed embodiments utilizing functionally equivalent elements to those described herein. Any and all such variations or modifications as well as others which may become apparent to those skilled in the art, are intended to be included within the scope of the invention as defined by the appended claims.

What is claimed is:

1. A process for separating electronic devices connected with one another in a body, said process comprising the steps of:

covering a side of said body containing said electronic devices with an electrically non-conductive auxiliary layer having a thickness d, said body including an intermediate region connecting every two adjacent electronic devices;

forming openings in said auxiliary layer above said electronic devices, each of said openings exposing a contact of each of said electronic devices;

forming depressions in said auxiliary layer, of each said depressions having a depth t and located above a respective one of said intermediate regions, said depth being less than said thickness of said auxiliary layer;

thinning a side of said body remote from said electronic devices;

testing electrical parameters of said electronic devices on said thinned body using said exposed contacts; and upon completion of said testing step, separating said electronic devices.

2. The process according to claim 1, further comprising the step of forming indentations in said side of said body remote from said electronic devices, each of said indentations being formed in the area of a respective one of said intermediate regions connecting every two adjacent electronic devices, each of said indentations extending in a direction toward said auxiliary layer.

3. The process according to claim 2, wherein said step of testing is performed after said step of forming indentations.

4. The process according to claim 1, wherein said auxiliary layer is made from a material having a mechanical strength sufficient in view of said thickness and said depth, so that during said step of testing, said every two adjacent electronic devices remain connected with one another by a remaining portion of said auxiliary layer.

5. The process according to claim 1, wherein said auxiliary layer is made from a polyimide material.

6. The process according to claim 5, wherein said polyimide material is photosensitive.

7. The process according to claim 1, wherein said steps of forming openings and said depressions in said auxiliary layer employ a partially transparent mask layer.

8. The process according to claims 1, wherein said step of separating takes place in an apparatus for attaching said electronic devices to a carrier.

9. The process according to claim 2, further comprising the step of metallizing said side of said body remote from said electronic devices after said step of forming said indentations.

10. The process according to claim 2, further comprising the step of metallizing said side of said body remote from said electronic devices prior to said step of forming said indentations.

11. The process according to claim 2, further comprising the steps of:

forming a delay layer on said side of said body remote from electronic devices prior to said step of thinning, said delay layer operating to delay the thinning of said body in step thinning; and creating openings in said delay layer in the area of said intermediate regions prior to said step of thinning;

wherein said step of thinning and said step of forming indentations are performed simultaneously.

12. The process according to claim 1, further comprising the step of removing said auxiliary layer after said step of separating said electronic devices.

13. A process for enabling the testing of electronic devices connected to one another in a first side of a body, said process comprising the steps of:

covering said side of said body with an electrically non-conductive layer;

forming openings in said layer above said electronic devices, each of said openings exposing a contact of each of said electronic devices;

thinning a second side of said body opposite to said first side;

electrically isolating said electronic devices from one another by forming indentations in said second side of said body, each of said indentations being formed in a respective region of said body connecting every two adjacent electronic devices, each of said indentations extending in a direction toward said layer; and testing electrical parameters of said electronic devices on said thinned body through said exposed contacts prior to separation.

14. The process according to claim 13, further comprising the step of separating said electronic devices after said step of testing.

15. The process according to claim 13, further comprising the step of forming depressions in said layer, each of said depressions having a depth and being located above a region of said body disposed between every two adjacent electronic devices, said depth being less than said thickness of said layer.

16. The process according to claim 15, further comprising the step of metallizing said second side of said body after said step of forming said indentations.

17. The process according to claim 15, further comprising the step of metallizing said second side of said body prior to said step of forming said indentations.

18. The process according to claim 15 further comprising the steps of:

forming a delay layer on said second side of said body prior to said step of thinning, said delay layer operating to delay the thinning of said body during said step thinning; and creating openings in said delay layer in the area of said regions of said body disposed between every two adjacent electronic devices, prior to said step of thinning;

wherein said step of thinning and said step of forming indentations are performed simultaneously.

* * * * *